United States Patent
Bell et al.

(10) Patent No.: US 6,956,785 B2
(45) Date of Patent: Oct. 18, 2005

(54) METHOD AND APPARATUS FOR SAVING CURRENT IN A MEMORY DEVICE

(76) Inventors: Debra M. Bell, 8713 Mediterrnean Ct., Boise, ID (US) 83709; Adrian J. Drexler, P.O. Box 170052, Boise, ID (US) 83717

(\*) Notice: Subject to any disclaimer, the term of this patent is extended or adjusted under 35 U.S.C. 154(b) by 0 days.

(21) Appl. No.: 10/915,155

(22) Filed: Aug. 9, 2004

(65) Prior Publication Data

US 2005/0007847 A1 Jan. 13, 2005

Related U.S. Application Data

(63) Continuation of application No. 10/211,023, filed on Aug. 1, 2002, now Pat. No. 6,834,023.

(51) Int. Cl.$^7$ ................................. G11C 7/00
(52) U.S. Cl. ............... 365/226; 365/203; 365/230.01
(58) Field of Search ................. 365/226, 203, 365/230.01, 230.03, 227

(56) References Cited

U.S. PATENT DOCUMENTS 5,631,871 A \* 5/1997 Park et al. ................ 365/203
5,699,309 A \* 12/1997 Cronin et al. ............. 365/203

\* cited by examiner

*Primary Examiner*—Anh Phung
(74) *Attorney, Agent, or Firm*—Snell & Wilmer, LLP (57) ABSTRACT

A memory device is configured to conserve electrical current by disabling the address lines provided to a memory bank when the address is not needed, such as during periods of automatic precharge. Because address data need not be provided while the bank is in an automatic precharge mode, the current used to keep the address lines active during this time may be conserved by suitably disabling the address lines for the duration of the automatic precharge. Disabling the various address lines may be accomplished by, for example, interposing a enabling element such as a field effect transistor within the address bus driver circuits leading to each bank, and by providing a suitable control signal to the enabling element to activate and deactivate the address line as needed.

19 Claims, 9 Drawing Sheets

METHOD AND APPARATUS FOR SAVING CURRENT IN A MEMORY DEVICE

CROSS-REFERENCE TO RELATED APPLICATIONS

This application is a continuation of and claims priority to U.S. patent application Ser. No. 10/211,023, filed Aug. 1, 2002, now U.S. Pat. No. 6,834,023, issued on Dec. 21, 2004.

FIELD OF THE INVENTION

This invention relates generally to electronic memory devices. More particularly, various embodiments of the present invention provide systems, devices and methods for saving current in a memory device.

BACKGROUND OF THE INVENTION

Memory devices are now present in virtually every computing device found in home and business settings. Personal computers, workstations, servers and other computer systems, for example, typically use random access memory (RAM) devices to store data and instructions to be executed by the computer. Although various forms of digital memory devices have been in use for several decades, engineers are continually looking for opportunities for improvement in terms of increasing the speed with which data can be accessed, reducing the size of the memory device, reducing the amount of electrical power consumed by the device, or the like.

Figure 1:
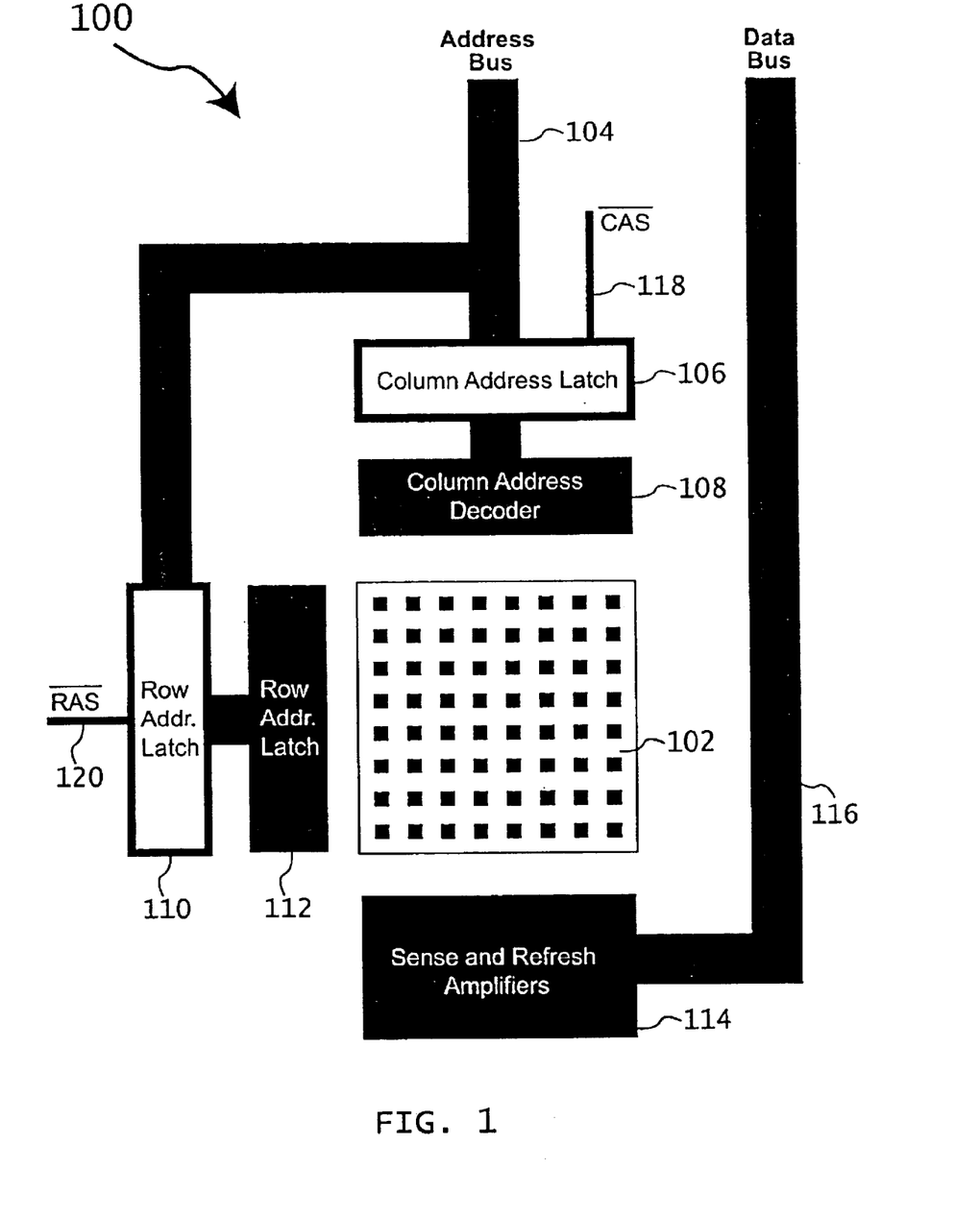
FIG. 1 is a conceptual block diagram of a prior art dynamic random access memory.

One type of memory device that is presently in common use is the dynamic random access memory (DRAM). DRAMs use large arrays of capacitive elements to store electrical signals representing binary digits ("bits") of information. FIG. 1 is a conceptual block diagram of a conventional DRAM. With reference now to FIG. 1, a memory bank 102 suitably includes a large number of capacitive elements conceptually arranged in a grid pattern. Each capacitive element is typically addressable by a row address and a column address representing the location of a cell within the memory bank 102.

A central processing unit (CPU) or other computing component typically references a memory cell by providing the cell's address to the memory device via an address bus 104 made up of several (typically 2–16) electrical conductors called "address lines". Address bus 104 typically transports row and column addresses that correspond to individual memory cells within memory bank 102 in which data may be stored or retrieved. Addresses transmitted on address bus 104 are typically received and initially stored in a column address latch 106 and/or a row address latch 110, as appropriate, prior to processing by memory device 100. Control signals such as row address strobe (/RAS) and column address strobe (/CAS) signals are provided from a controller (not shown in FIG. 1) to latch the row and column addresses, respectively, to a row decoder 112 and a column decoder 108. The /CAS and /RAS signals are frequently described with a preceding "/" to indicate that these signals are typically enabled when they are in a low voltage logic state.

Decoders 112 and 108 suitably decode the row and column addresses, respectively, to access the appropriate cell in memory bank 102. The controller typically also provides a write enable (/WE) signal that is active when data is being written to the cell. The /WE signal is typically deactivated when data is being read from the cell.

Data stored within each DRAM cell is conventionally represented as a logic "0" or a logic "1" corresponding to low and high voltages, respectively, stored in the capacitive element. Because the charge stored within a capacitor typically degrades over time, the capacitors typically need to be refreshed relatively frequently. Memory device 100 therefore includes amplifiers 114 to refresh the electrical signals contained within each node capacitor in memory bank 102, and to transfer data between memory bank 102 and data bus 116.

With continuing reference to FIG. 1, an exemplary process in a conventional DRAM read process suitably begins with a processor or CPU placing a row address for data to be retrieved on address bus 104. The row address is received on address pins in the DRAM module 100, and the address is stored in row address latch 110 when the /RAS pin becomes active. Row address decoder 112 then selects the row to be accessed. With the write enable (/WE, not shown) disabled, the column address desired by the processor CPU is placed on address bus 104. This address is stored within column address latch 106 until the /CAS signal becomes active, at which time the column address is provided to column address decoder 108. A combination of control signals such as /RAS, /CAS and /WE signals are suitably decoded to enable the output for data interface 114 to retrieve the identified data in databank 102 and to provide the data on databus 116. A combination of control signals such as /RAS, /CAS and /WE signals may be subsequently used to issue a precharge to the device. During this precharge period, data cannot typically be stored or retrieved in memory bank 102. A conventional DRAM write process executes similar steps as the read process described above in selecting an address to receive data from data bus 116.

In more recent years, synchronous dynamic random access memory (SDRAM) has become increasingly popular. SDRAMs typically combine multiple banks of memory elements onto a single module for additional data storage. SDRAMs are referred to as "synchronous" because they typically incorporate clock signals received from the host computer. An exemplary SDRAM memory device is described in U.S. Pat. No. 6,215,709, "Synchronous Dynamic Random Access Memory Device" which issued on Apr. 10, 2001 and is incorporated herein by reference in its entirety. A number of advanced techniques have been incorporated into DRAMs and SDRAMs, including the "automatic precharge" which precharges the appropriate elements in the memory device without the need for an explicit instruction to the memory device. An example of a memory device incorporating automatic precharge techniques is described in U.S. Reissue Pat. No. Re35,750 entitled "Word Line Driver Circuit Having An Automatic Precharge Circuit" which issued on Mar. 24, 1998 and is incorporated herein by reference in its entirety.

A continuing challenge in designing new memory devices is to reduce the amount of electrical power consumed by such devices. This need is driven by, among other things, increasing miniaturization in computing devices such as notebook computers, personal digital assistants, cellular phones, and the like where battery power may be in limited supply. It is also driven by a desire to provide increasingly functional or fast memory devices that operate within electrical constraints that may be set by industry standards, or by computer or processor manufacturers. Accordingly, it is desirable to reduce the amount of electrical current consumed within a random access memory device. These and other aspects of the invention shall become more apparent when read in conjunction with the accompanying drawing figures and the attached detailed description of exemplary embodiments.

SUMMARY OF THE INVENTION

According to various exemplary embodiments of the present invention, a memory device is configured to conserve electrical current by disabling the address lines provided to a memory bank when address data is not needed, such as during automatic precharge periods. Because address data need not be provided to that bank while the bank is in auto-precharge mode, the current used to keep the address lines active during this time may be conserved by disabling the address lines as appropriate. Disabling the various address lines may be accomplished by, for example, interposing an enabling element such as a field effect transistor within the address bus driver circuits leading to each bank, and by providing a suitable control signal to the enabling element to activate and deactivate the address line as appropriate.

BRIEF DESCRIPTION OF THE DRAWINGS

The features and advantages of the present invention are hereinafter described in the following detailed description of illustrative embodiments to be read in conjunction with the accompanying drawing figures, wherein like reference numerals are used to identify the same or similar parts in the similar views, and.

DETAILED DESCRIPTION OF EXEMPLARY EMBODIMENTS

According to various exemplary embodiments of the invention, the address lines leading to each memory bank in a memory device are suitably disabled during periods of non-use such as during automatic precharge cycles. By disabling the address lines during such periods, the current used by the memory device to drive the address lines can be conserved, and the overall power consumed by the memory device is suitably reduced.

The present invention may be described herein in terms of functional block components and various processing steps. It should be appreciated that such functional blocks may be realized by any number of hardware and/or software components configured to perform the specified functions. For example, various components of the present invention may employ various integrated circuit or discrete components, e.g., memory elements, processing elements, logic elements, and the like, which may carry out a variety of functions under the control of one or more processors, controllers, programmable logic devices, or other devices. Similarly, the software elements of the present invention may be implemented with any programming or scripting language such as C, C++, Java, assembler, PERL or the like, with the various algorithms being implemented with any combination of data structures, objects, processes, tables, routines or other programming elements. For the sake of brevity, conventional electronics and integrated circuit techniques, as well as software development and other functional aspects of the systems (and components of the individual operating components of the systems) may not be described in detail herein. Various embodiments of the present invention could employ any number of conventional techniques for electronics configuration, signal processing, data processing and the like. Moreover, the electrical circuits disclosed herein may be readily modified in other embodiments through application of general electrical and electronic principles.

Figure 2:
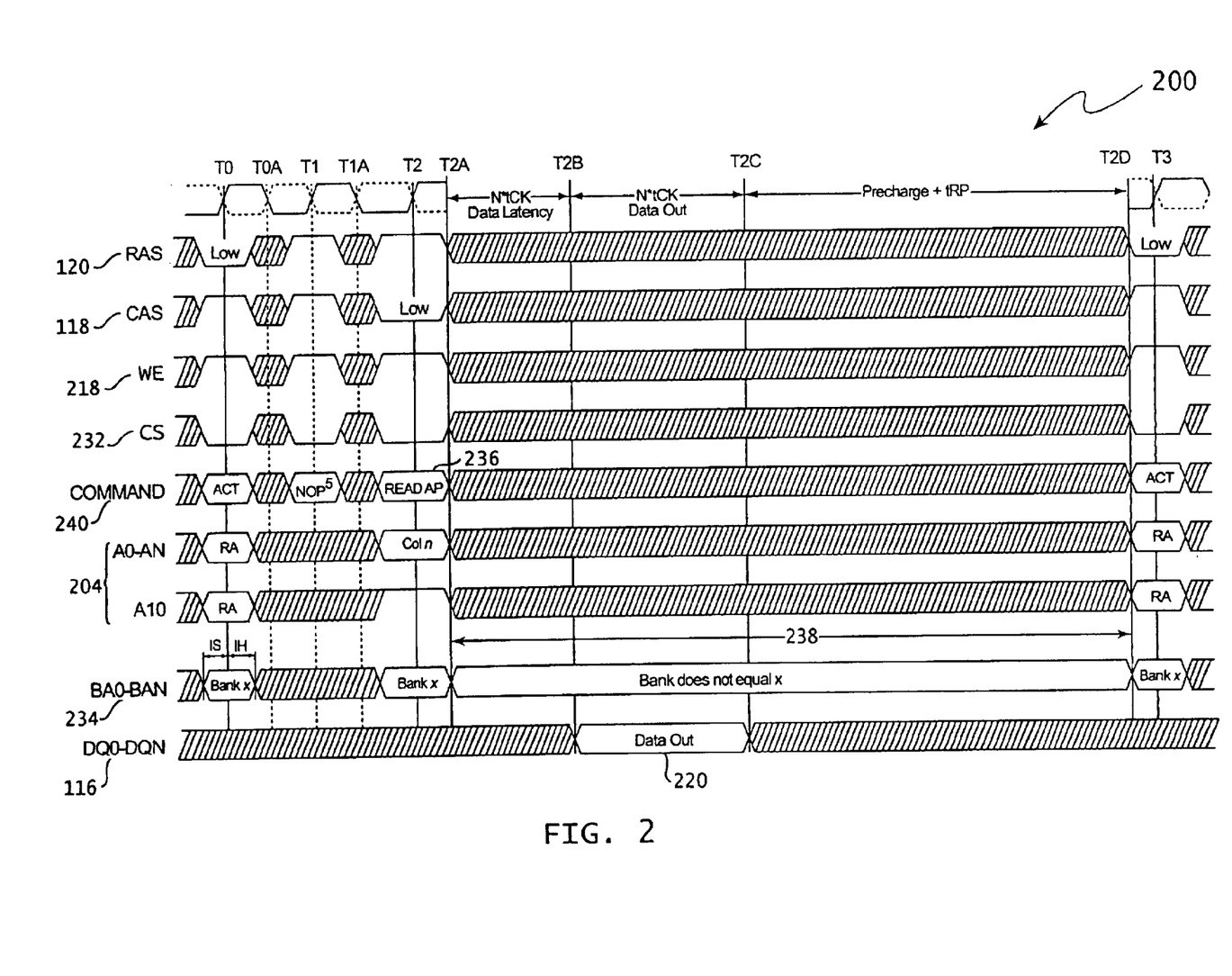
FIG. 2 is a timing diagram for an exemplary memory element showing opportunities for address line disablement.

FIG. 2 is a timing diagram of an exemplary read process 200 with an automatic precharge as may be executed by a memory device such as a DRAM or SDRAM. With reference now to FIG. 2, a controller suitably provides row address strobe 120 (/RAS) and column address strobe 118 (/CAS) signals along with row and column addresses on address bus 104. The signals may be provided by, for example, a microprocessor, microcontroller, memory controller, or other digital interface. A conventional write enable (/WE) signal 218, and/or chip select (CS) signal 232 may also be provided to allow the memory device to decode commands or instructions from a processor (shown in FIG. 5). The command decoded by command signals such as /RAS, /CAS, and /WE is shown on line 240. /RAS 120 and /CAS 118 signals become active when row or column information, respectively, is present on address bus 104. The active memory bank for receiving data is selected using one or more bank selection signals 234.

According to JEDEC standards for SDRAM devices, an automatic precharge is issued to a memory bank 102 for a read cycle by holding address signal A10 high while a read command 236 is issued from the external processor. While the device remains in an automatic precharge mode, address information provided on address bus 104 cannot typically be processed by memory bank 102. Accordingly, the current provided to the address driver circuitry for memory bank 102 may be disabled during some or all of time period 238, thereby conserving current without delaying or otherwise degrading performance of the memory device. Because each memory bank 102 is conventionally coupled to the internal address bus by multiple address lines/driver circuits, the amount of current saved by disabling the address lines during periods of automatic precharge can be significant.

In a memory device having multiple memory banks (see FIGS. 4A and 5), the current savings can be further increased by sequentially and/or independently disabling address lines leading to each bank 102 during appropriate times. In a conventional SDRAM design, effective response times of the device are reduced by overlapping active, read, write and precharge periods between multiple banks 102 such that one memory bank 102 is in an automatic precharge mode while another memory bank 102 is being accessed. Accordingly, disabling the address lines to any particular memory bank 102 during the automatic precharge period for that bank does not necessarily preclude the simultaneous use of the main bus to deliver address information to other memory banks 102, nor does the disabling create additional delay in the total device.

Figure 3:
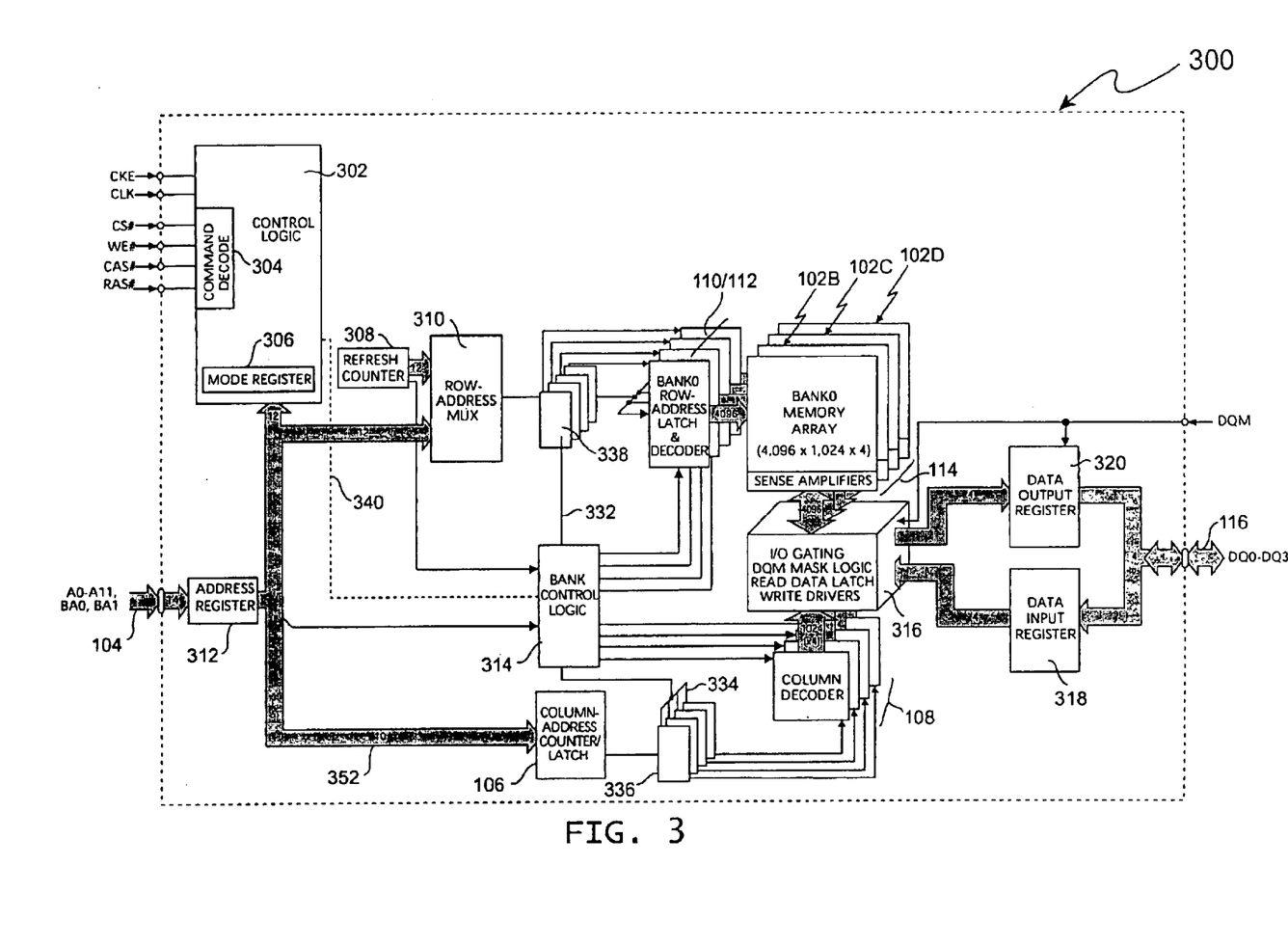
FIG. 3 is a block diagram of an exemplary synchronous dynamic random access memory.

FIG. 3 is a functional block diagram of an exemplary synchronous dynamic random access memory device having circuitry for disabling address lines during appropriate periods of time. With reference now to FIG. 3, an exemplary SDRAM device 300 suitably includes a number of memory banks 102A–D receiving address data via an internal address bus 352 from address register 312. Address register 312 suitably acts as an interface to address bus 104 by storing address information received on address bus 104 and providing the information to column address latch 106 and row address multiplexer 310 via internal address bus 352. Row address multiplexer 310 suitably provides the row address to latch and decoder circuit 110/112 corresponding to the appropriate memory bank 102A–D being accessed. Similarly, column address latch 106 provides column address information to a column decoder 108 corresponding to the selected memory bank 102A–D. Data input register 318 suitably retrieves data from data bus 116 as appropriate, and provides the data to gating circuit 316, which interacts with sense amplifiers 114 in memory banks 102A–D to input electrical signals to the memory banks 102A–D. Data retrieved from memory banks 102A–D is provided from gating circuit 316 to data output register 320 where the data can be placed on data bus 116. An external controller may also provide a conventional data mask DQM signal, as appropriate. Gating circuit 316 suitably includes logic to handle DQM masks and to transfer data between memory banks 102A–D and input/output registers 318/320.

The various decoders, latches and other circuitry for processing data in memory device 300 are suitably controlled by a control network including control logic 302 and bank control logic 314. Control logic 302 includes any form of controller, processor or the like suitable for retrieving the various command signals (e.g. /CAS, /RAS, /WE) as well as a clock signal or other appropriate signals from the computing host at a command decode module 304. Control logic 302 may also include a mode register 306 for storing command and control information. Control logic 302 suitably provides timing, control and other logic to the various modules of memory device 300 such that data is appropriately processed.

Bank control logic 314 suitably receives control information 340 from control logic 302 and is responsive to address information on address bus 104 to activate a selected memory bank 102A–D and its associated components at appropriate times to store and retrieve data. In an exemplary embodiment, bank control logic 314 also provides control signals 332 and 334 to activate or deactivate row and column address lines to the respective memory banks 102A–D as appropriate. Control signals 332 and 334 are suitably received at driver circuits 338 and 336, respectively, such that the appropriate row and column addresses can be deactivated at appropriate times. Bank control logic 314 may also be responsive to a refresh counter 308 that suitably tracks refresh cycles applied to the various memory banks 102A–D.

Of course many different embodiments of a memory device 300 could be formulated within the scope of the invention. For example, the control signals 332 and 334 to disable circuits 338 and 336 may emanate directly from control logic 302 or through any other controller or digital interface. Similarly, the disable circuits 338 and 336 may be located in any other location in memory device 300 such as between decoders 108 and memory banks 102A–D, between decoders 112 and memory banks 102A–D, between row and column latches and row/column decoders as shown, or in any other position. Alternatively, the disable functionality provided by circuits 338 and 336 may be incorporated into decoder circuitry 112/108, into gating circuit 316, or into any other portion of memory device 300. Disable circuits 338 and 336 may be combined with address driver circuitry for the various memory banks 102A–D, as described more fully below.

Figure 4A:
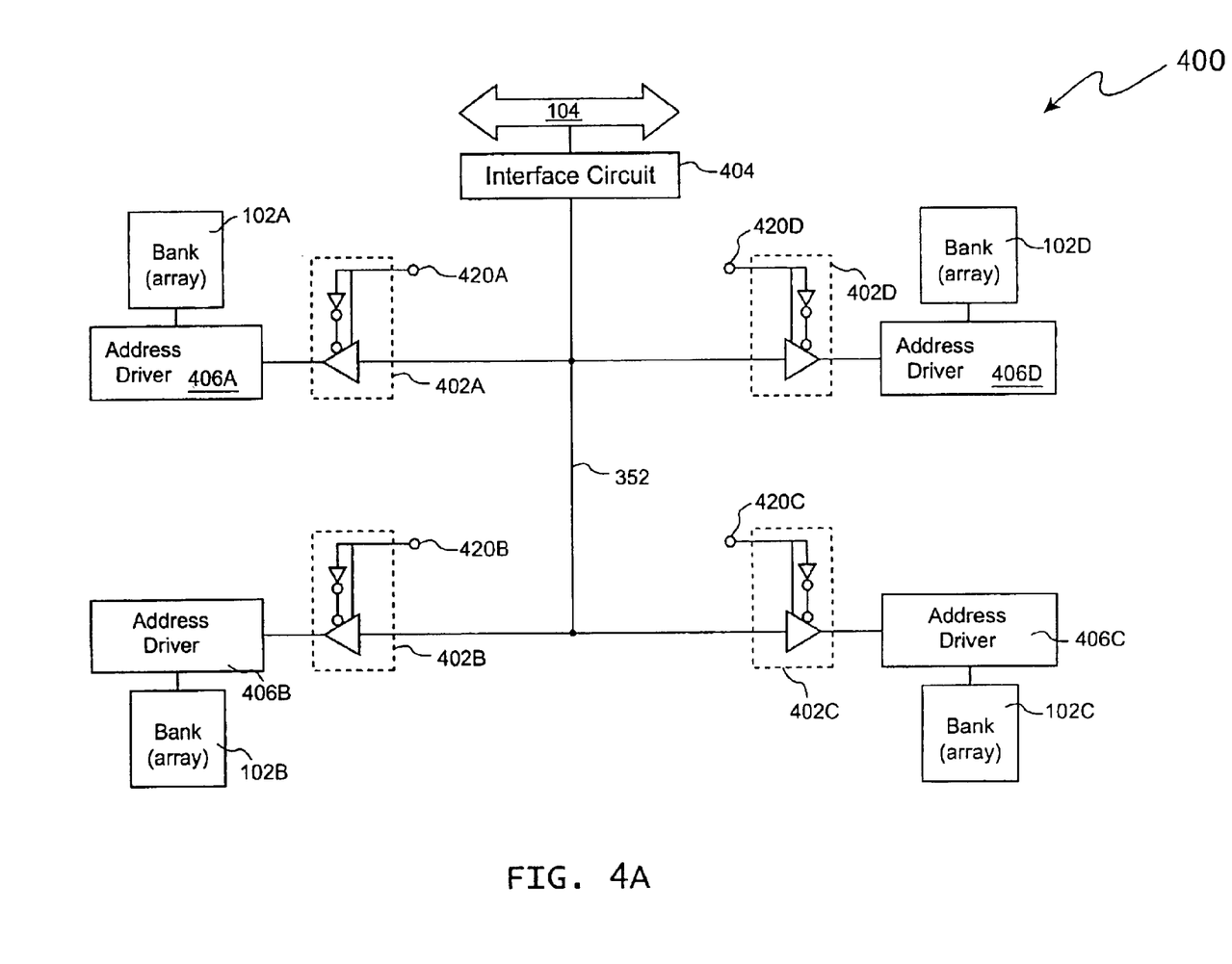
FIG. 4A is a block diagram of an exemplary enablement scheme.

FIG. 4A is a block diagram of an exemplary disabling scheme for address lines leading to four memory banks. With reference now to FIG. 4A, an exemplary disabling scheme 400 that may be used to implement circuits 338 and 336 of FIG. 3 suitably includes an enabling circuit 402A–D coupling each address line of each bank 102A–D to an internal address bus 352. Data on system address bus 104 is provided via interface circuit 404 to internal address bus 352. Interface circuit 404 may include an address register 312 as shown in FIG. 3. Each address line leading into each memory bank 102 (FIG. 3) is suitably coupled to the bank using an enabling circuit 402 and an address driver circuit 406 such that the enabling circuit 402 is configured to disable driver circuit 406 at appropriate times.

Figure 4B:
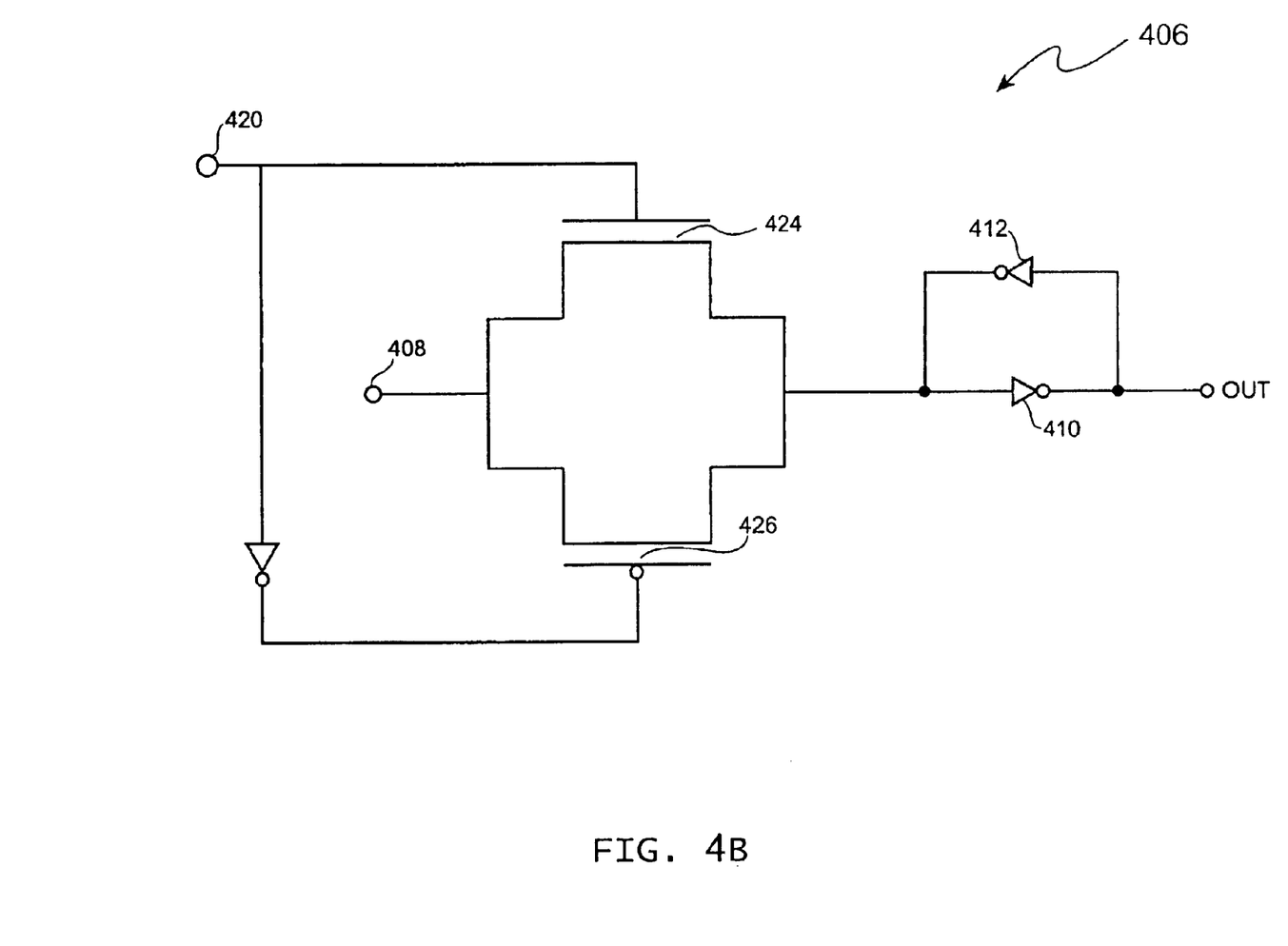
FIG. 4B is a circuit diagram of an exemplary enabling circuit.

With continued reference to FIG. 4A, each enabling circuit 402A–D suitably includes a pass gate with an enabling input 420A–D received from control logic 302, from bank control logic 314, or from any other appropriate interface or source. Control signal 420 is provided to the pass gate and may include an optional second branch that is inverted and provided to an inverting input of the gate as shown in FIG. 4A. An example form of this enabling circuit 402 is shown in FIG. 4B, which shows two field effect transistors (FET), one N-channel device 424 and one P-channel device 426 coupled to control signal 420 and the inversion of control signal 420 respectively. An input 408 that is coupled to the device's internal address bus 352 is suitably switched by transistors 424 and 426 to produce an output that can be provided to address driver 406. Inverters 410 and 412 are configured as a latch such that the signal output of 410 remains a constant latched input into driver 406 thus producing a relatively steady signal at the output of circuit 402.

Figure 4C:
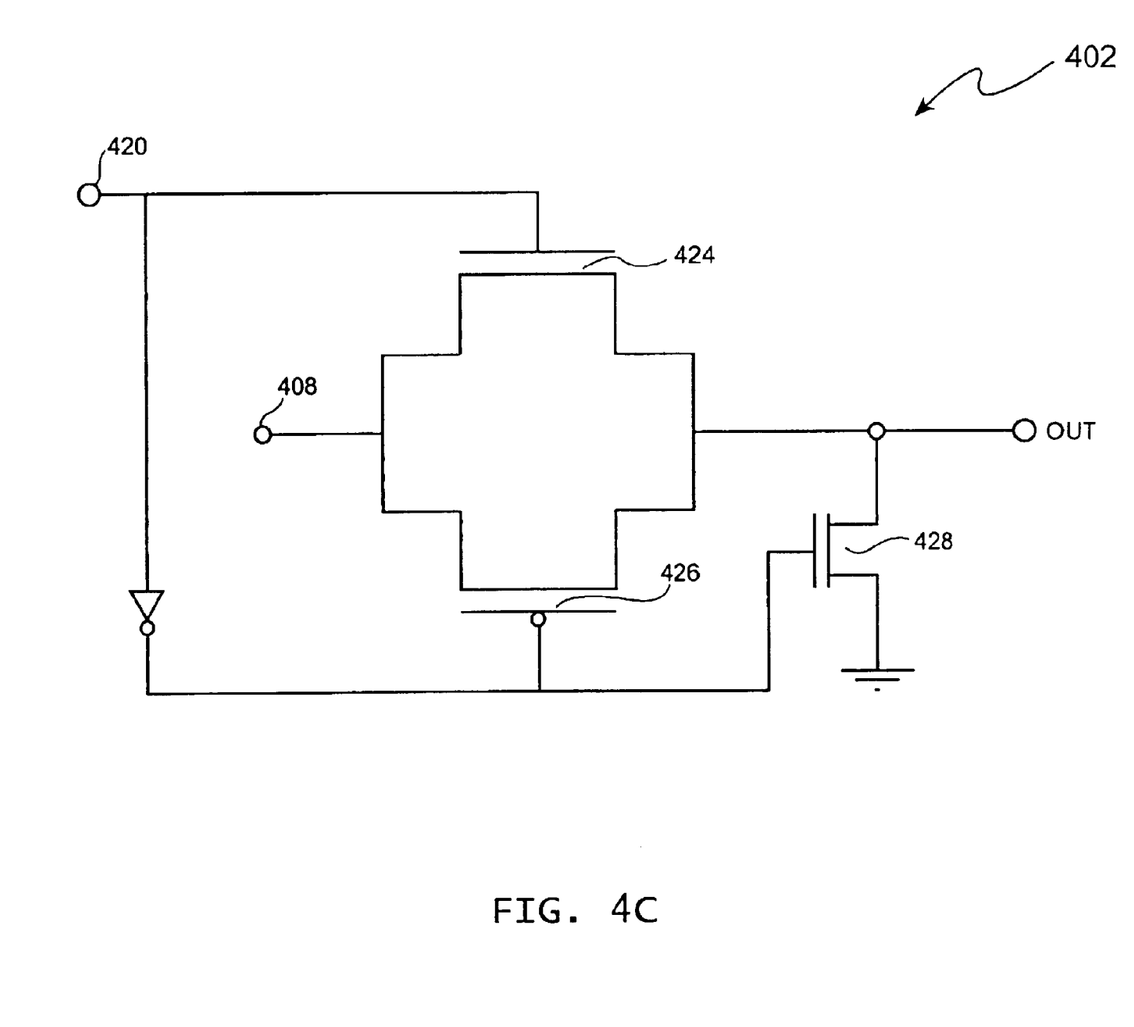
FIG. 4C is a circuit diagram of a second exemplary embodiment of an enabling element.
Figure 4D:
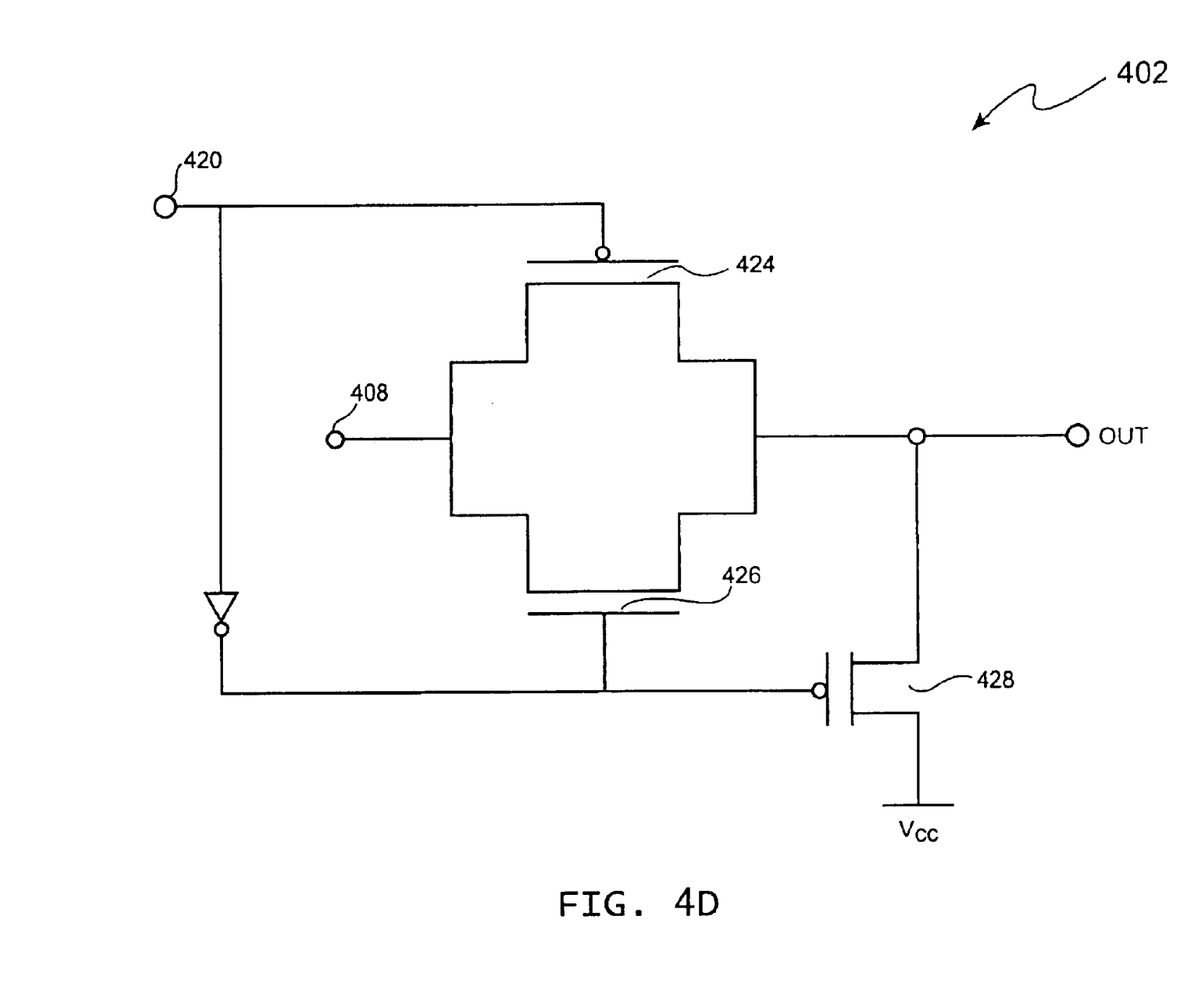
FIG. 4D is a circuit diagram of a third exemplary embodiment of an enabling element.

Further alternate embodiments of enabling circuit 402 are shown in FIGS. 4C and 4D. With reference now to FIGS. 4C–D, control input 420 may be used to control gate 428 that couples the circuit output to a high or low bias voltage, as appropriate. These "pull down" (FIG. 4C) and "pull up" (FIG. 4D) embodiments may consume more current than the embodiment shown in FIG. 4B, particularly if the address line is exhibiting a logically opposite state at the time that the address line is enabled, since this would cause a state transition on the line, which in turn draws current. Nevertheless, the activation circuits shown in FIGS. 4C–D may toggle fewer address lines and prevent successive unwanted transitions, thus making the circuit 402 desirable for some embodiments.

Figure 4E:
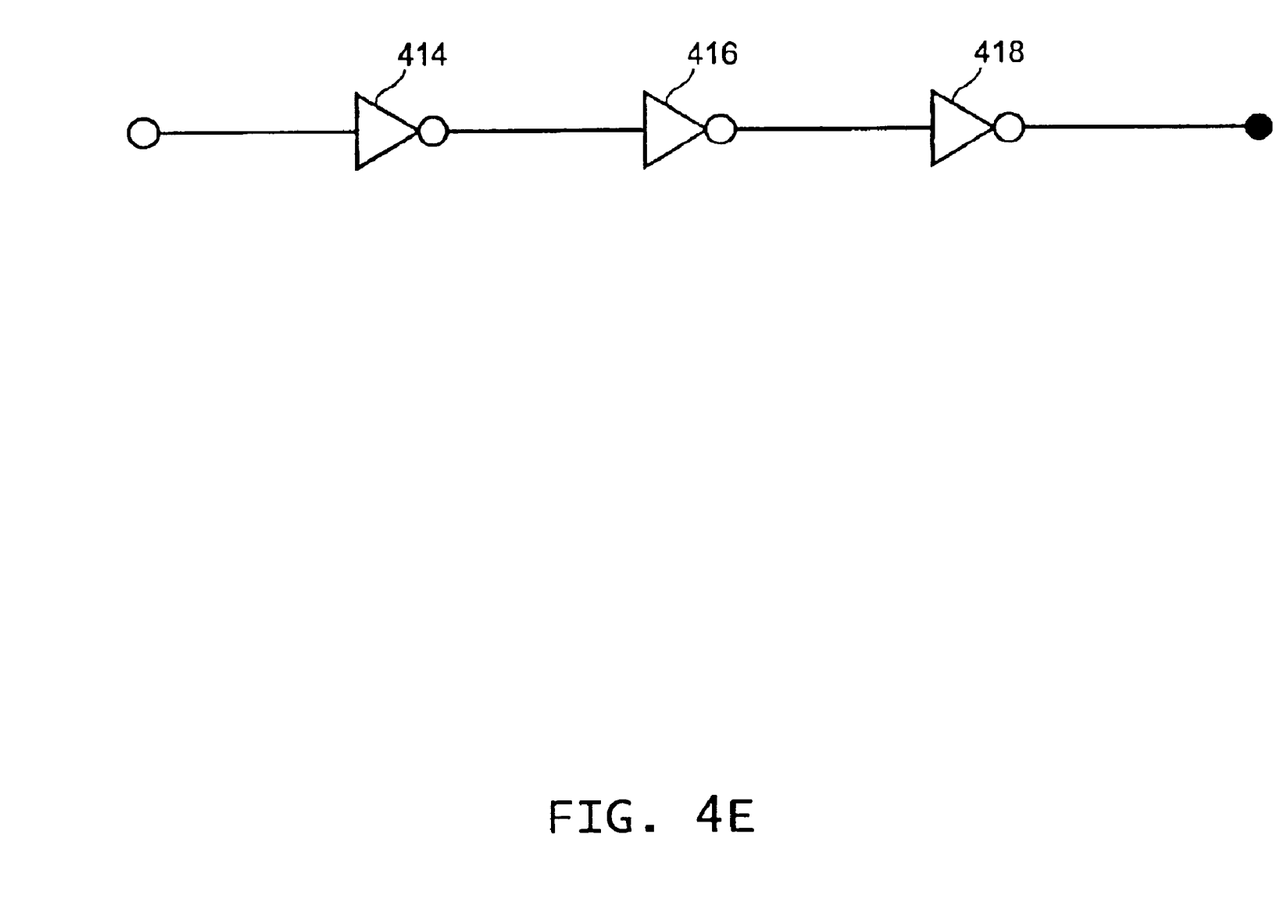
FIG. 4E is a circuit diagram of an exemplary bank driver circuit.

With reference now to FIG. 4E, an exemplary driver circuit 406 for an address line suitably includes any number of buffers or inverters 414, 416 and/or 418. The various buffers and inverters may be configured to induce delay in the system, to amplify electrical signals received at the input, or to produce a logic inversion as desired. Of course any conventional driver circuit may be used in alternate embodiments of the invention, and the disabling circuits 402 may be readily combined with driver circuits 406 in many practical embodiments.

Figure 5:
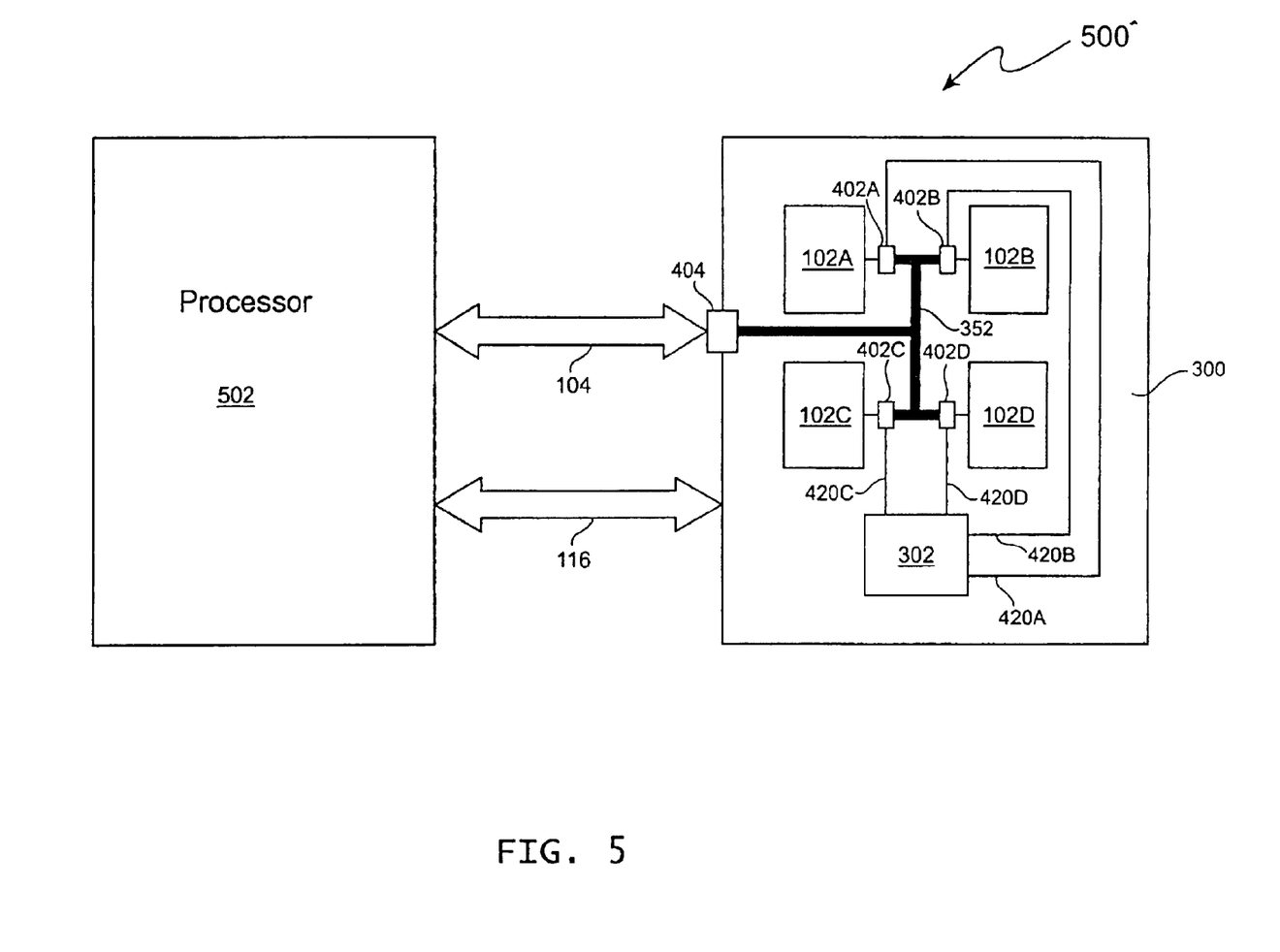
FIG. 5 is a block diagram of an exemplary system incorporating address line current management.

FIG. 5 is a block diagram of a computer system including address line shutdown during appropriate cycles. With reference now to FIG. 5, a computer system 500 suitably includes a processor 502 and a memory device 300 communicating via an address bus 104 and a data bus 116. Computer system 500 may be any type of conventional computer system, workstation, server, personal digital assistant, mobile phone, video game console or other computing device. Processor 502 may be any sort of microprocessor, digital signal processor, microcontroller or other processing device. Memory device 300 is any type of DRAM, SDRAM or the like capable of storing digital data received on data bus 116 in a location with a corresponding address that can be identified via signals on address bus 104. Address and data buses 104/116 may be implemented with any conventional bus architecture such as PCI or the like.

Memory device 300 suitably includes one or more memory banks 102A–D for storing data, as described above. Address bus 104 is connected to an internal address bus 352 in memory device 300 by an interface circuit 404. Each of the various memory banks 102A–D are logically coupled to address bus 104 via an enabling circuit 402A–D as described in FIG. 4A above, which in turn is coupled to a memory controller 302. Controller 302 suitably provides control signals 420A–D as appropriate to enable and disable the connection between each memory bank 102A–D during periods of automatic precharge associated with read and write cycles, as described above. The control signals 420 may be provided so that different memory banks 102 are enabled/disabled at different periods of time such that one or more banks are disabled while other memory banks 102 remain enabled. This allows for conservation of electrical power without significantly degrading data throughput times, since one or more banks may remain active at all times while power is conserved by. disabling address drivers during periods that address data is not needed, such as during periods of automatic precharge.

Accordingly, current consumed by a memory device 300 may be reduced by disabling the address line drivers 406 (FIG. 4) provided to a memory bank 102 during periods of relative non-use. Examples of periods of relative non-use include, for example, periods of time associated with automatic precharge periods, as best shown in FIG. 2. As shown therein, periods of time such as periods 238 provide ample opportunity to disable the address drivers leading into memory bank 102 such that current used to drive the drivers is not required during the period of non-use, thereby reducing the amount of current consumed by the memory device 300.

The various techniques described herein for disabling address lines to banks of memory may be adopted or expanded in many ways. For example, any form of switching circuitry such as relays, FETs, switches or the like could be used to produce an enabling circuit such as that shown as element 402 in FIG. 4A. Still further, although read procedures are primarily described herein to ease understanding, equivalent concepts are readily applied to write processes that also incorporate automatic precharge periods.

It should be appreciated that the particular implementations shown and described herein are examples of the invention and are not intended to otherwise limit the scope of the present invention in any way. The connecting lines shown in the various figures contained herein are intended to represent exemplary functional relationships and/or physical or logical couplings between the various elements. It should be noted that many alternative or additional functional relationships, physical connections or logical connections may be present. The corresponding structures, materials, acts and equivalents of all elements in the claims below are intended to include any structure, material or acts for performing the functions in combination with other claimed elements as specifically claimed. Moreover, the steps recited in any method claims may be executed in any order. The scope of the invention should be determined by the appended claims and their legal equivalents, rather than by the examples given above. No item or component is essential to the practice of the invention unless the element is specifically described herein as "essential" or "critical".

What is claimed is:

1. A method, comprising:
    executing an automatic precharge function in a memory module of a computing device comprising a plurality of address lines coupled to a plurality of memory banks via a plurality of enable circuits to place the memory module in a precharge mode; and
    disabling a first address line coupled to a first memory bank via a first enable circuit in the memory module while the memory module remains in the precharge mode to reduce the amount of current consumed by the memory module.

2. The method of claim 1, further comprising:
    one of enabling and re-enabling the first address line if the memory module exits the precharge mode.

3. The method of claim 1, wherein disabling the first signal line comprises:
    providing a disable control signal to the first enable circuit to disable the first address line.

4. The method of claim 1, further comprising:
    disabling a second address line coupled to a second memory bank via a second enable circuit in the memory module while the memory module remains in the precharge mode to further reduce the amount of current consumed by the memory module.

5. The method of claim 4, further comprising:
    one of sequentially, independently and both sequentially and independently disabling the first address line and the second address line during appropriate times to further reduce the amount of current consumed by the memory module.

6. The method of claim 5, wherein appropriate times comprises:
    overlapping one of active, read, write and precharge periods of the first memory bank with one of active, read, write and precharge periods of the second memory bank.

7. The method of claim 6, wherein overlapping comprises:
    operating the first memory bank in precharge mode while the second memory bank is being accessed.

8. The method of claim 4, further comprising:
    enabling one of the first address line and the second address line if one of the first memory bank and the second memory bank exits the precharge mode, respectively.

9. A method of reducing current consumption in a memory module comprising a plurality of memory banks, each of the memory banks comprising address lines associated therewith, the method comprising:
    executing an automatic precharge to place a first memory bank in a precharge mode;
    disabling the address lines associated with the first memory bank while the first memory bank remains in the precharge mode; and
    enabling the address lines associated with the first memory bank if the first memory bank exits the precharge mode.

10. The method of claim 9, further comprising:
    allowing a second memory bank to remain active while the address lines associated with the first memory bank are disabled.

11. A method of reducing current consumption in a memory module comprising a plurality of memory banks, each of the memory banks comprising address lines associated therewith, the method comprising:

executing an automatic precharge to place a first subset of memory banks of the plurality of memory banks in a precharge mode; and disabling the address lines associated with each respective memory bank of the first subset of memory banks while each respective memory bank of the first subset of memory banks remains in the precharge mode.

12. The method of claim 1, further comprising:

enabling the address lines associated with each respective memory bank of the first subset of memory banks if each respective memory bank of the first subset of memory banks exits the precharge mode.

13. The method of claim 11, further comprising:

allowing at least a first memory bank of the plurality of memory banks to remain active while the address lines associated with the first subset of memory banks are disabled.

14. The method of claim 13, wherein executing an automatic precharge to place a subset of memory banks of the plurality of memory banks in a precharge mode comprises:

executing an automatic precharge to each memory bank of the plurality of memory banks except the first memory bank.

15. The method of claim 13, further comprising:

one of sequentially, independently and both sequentially and independently disabling each address line of the first subset of memory banks during appropriate times.

16. The method of claim 15, wherein appropriate times comprises:

overlapping one of active, read, write and precharge periods of the first memory bank with one of active, read, write and precharge periods of a second memory bank.

17. The method of claim 16, wherein overlapping comprises:

operating the second memory bank in precharge mode while the first memory bank is being accessed.

18. The method of claim 11, further comprising:

allowing a second subset of the plurality of memory banks to remain active while the address lines associated with the first subset of memory banks are disabled.

19. The method of claim 11, further comprising:

one of sequentially, independently and both sequentially and independently disabling each address line of the first subset of memory banks during appropriate times.

* * * * *

UNITED STATES PATENT AND TRADEMARK OFFICE
CERTIFICATE OF CORRECTION

PATENT NO. : 6,956,785 B2  Page 1 of 1
DATED : October 18, 2005
INVENTOR(S) : Bell et al.

It is certified that error appears in the above-identified patent and that said Letters Patent is hereby corrected as shown below:

Column 9,
Line 12, change "1" to -- 11 --.

Signed and Sealed this

Twenty-seventh Day of December, 2005

JON W. DUDAS
*Director of the United States Patent and Trademark Office*